(12) United States Patent
Herner

(10) Patent No.: US 11,515,328 B2
(45) Date of Patent: Nov. 29, 2022

(54) STAGGERED WORD LINE ARCHITECTURE FOR REDUCED DISTURB IN 3-DIMENSIONAL NOR MEMORY ARRAYS

(71) Applicant: SUNRISE MEMORY CORPORATION, Fremont, CA (US)

(72) Inventor: Scott Brad Herner, Portland, OR (US)

(73) Assignee: SUNRISE MEMORY CORPORATION, San Jose, CA (US)

(*) Notice: Subject to any disclaimer, the term of this patent is extended or adjusted under 35 U.S.C. 154(b) by 0 days.

(21) Appl. No.: 17/221,677

(22) Filed: Apr. 2, 2021

(65) Prior Publication Data

US 2021/0225873 A1 Jul. 22, 2021

Related U.S. Application Data

(63) Continuation of application No. 16/920,603, filed on Jul. 3, 2020, now Pat. No. 11,011,544, which is a continuation of application No. 16/530,842, filed on Aug. 2, 2019, now Pat. No. 10,741,582, which is a continuation of application No. 16/113,296, filed on Aug. 27, 2018, now Pat. No. 10,431,596.

(60) Provisional application No. 62/551,110, filed on Aug. 28, 2017.

(51) Int. Cl.
| | |
|---|---|
| *H01L 27/11568* | (2017.01) |
| *H01L 27/11578* | (2017.01) |
| *H01L 27/11582* | (2017.01) |
| *H01L 29/08* | (2006.01) |
| *H01L 29/792* | (2006.01) |

(52) U.S. Cl.
CPC .. *H01L 27/11582* (2013.01); *H01L 27/11568* (2013.01); *H01L 27/11578* (2013.01); *H01L 29/0847* (2013.01); *H01L 29/7923* (2013.01)

(58) Field of Classification Search
CPC ......... H01L 27/11582; H01L 27/11568; H01L 27/11578; H01L 29/0847; H01L 29/7923; H01L 27/11565
See application file for complete search history.

(56) References Cited

U.S. PATENT DOCUMENTS

| | | | | |
|---|---|---|---|---|
| 9,281,044 | B2* | 3/2016 | Ramaswamy | G11C 11/221 |
| 9,892,800 | B2* | 2/2018 | Harari | H05K 999/99 |
| 10,121,553 | B2* | 11/2018 | Harari | G11C 16/0491 |
| 10,121,554 | B2* | 11/2018 | Harari | G11C 16/0466 |
| 2013/0043455 | A1* | 2/2013 | Bateman | H01L 45/1226 |
| | | | | 257/5 |
| 2014/0340952 | A1* | 11/2014 | Ramaswamy | H01L 27/11597 |
| | | | | 257/295 |
| 2016/0086970 | A1* | 3/2016 | Peng | H01L 27/11582 |
| | | | | 257/324 |

(Continued)

*Primary Examiner* — Earl N Taylor
(74) *Attorney, Agent, or Firm* — Edward C. Kwok; VLP Law Group LLP

(57) ABSTRACT

A staggered memory cell architecture staggers memory cells on opposite sides of a shared bit line preserves memory cell density, while increasing the distance between such memory cells, thereby reducing the possibility of a disturb. In one implementation, the memory cells along a first side of a shared bit line are connected to a set of global word lines provided underneath the memory structure, while the memory cells on the other side of the shared bit line—which are staggered relative to the memory cells on the first side—are connected to global word lines above the memory structure.

14 Claims, 5 Drawing Sheets

(56) References Cited

U.S. PATENT DOCUMENTS

| | | | |
|---|---|---|---|
| 2017/0092370 A1* | 3/2017 | Harari | H01L 29/7926 |
| 2017/0092371 A1* | 3/2017 | Harari | H01L 29/66833 |
| 2017/0358599 A1* | 12/2017 | Ramaswamy | H01L 29/78391 |
| 2017/0358999 A1 | 12/2017 | Geske et al. | |
| 2018/0090219 A1* | 3/2018 | Harari | H01L 29/66833 |
| 2018/0108423 A1* | 4/2018 | Harari | G11C 16/0483 |
| 2018/0350832 A1* | 12/2018 | Barbato | H01L 27/11524 |
| 2018/0366489 A1* | 12/2018 | Harari | H01L 23/562 |
| 2019/0006014 A1* | 1/2019 | Harari | H01L 29/40117 |
| 2019/0006015 A1* | 1/2019 | Norman | G11C 16/3431 |
| 2019/0067327 A1* | 2/2019 | Hemer | H01L 27/11568 |
| 2020/0335519 A1* | 10/2020 | Hemer | H01L 27/11578 |

* cited by examiner

US 11,515,328 B2

STAGGERED WORD LINE ARCHITECTURE FOR REDUCED DISTURB IN 3-DIMENSIONAL NOR MEMORY ARRAYS

CROSS REFERENCES TO RELATED APPLICATIONS

This application is a continuation application of U.S. patent application Ser. No. 16/920,603 ("Parent Application"), entitled "Staggered Word Line Architecture for Reduced Disturb in 3-Dimensional NOR Memory Arrays," filed on Jul. 3, 2020, which is a continuation application of U.S. patent application Ser. No. 16/530,842, entitled "Staggered Word Line Architecture for Reduced Disturb in 3-Dimensional NOR Memory Arrays," filed on Aug. 2, 2019, which is a continuation application of U.S. patent application Ser. No. 16/113,296, entitled "Staggered Word Line Architecture for Reduced Disturb in 3-Dimensional NOR Memory Arrays," filed on Aug. 27, 2018, which claims priority of U.S. provisional patent application ("Parent Provisional Application"), Ser. No. 62/551,110, entitled "Staggered Word Line Architecture for Reduced Disturb in 3-Dimensional NOR Memory Arrays," filed on Aug. 28, 2017. This application is related to U.S. patent application ("Non-provisional Application"), Ser. No. 15/248,420, entitled "Capacitive-Coupled Non-Volatile Thin-film Transistor Strings in Three-Dimensional Arrays," filed Aug. 26, 2016. The Non-provisional Application is hereby incorporated by reference in its entirety. The Non-provisional Application has been published as U.S. 2017/0092371. References to the Non-provisional Application herein are made by paragraph numbers of the publication. The present application is also related to (i) U.S. provisional application ("Provisional Application I"), Ser. No. 62/522,666, entitled "Replacement Metal and Strut for 3D memory Array," filed on Jun. 20, 2017: U.S. provisional application ("Provisional Application II"), Ser. No. 62/522,661, entitled "3-Dimensional NOR String Arrays in Segmented Stacks," filed on Jun. 20, 2017; and (iii) U.S. provisional application ("Provisional Application III"), Ser. No. 62/522,665, entitled "3-Dimensional NOR String Arrays in Segmented Shared Store Regions," filed on Jun. 20, 2017. The Parent Application, the Parent Provisional Application, the Non-Provisional Application, and the Provisional Applications I, II and III are hereby incorporated by reference in their entireties.

BACKGROUND OF THE INVENTION

1. Field of the Invention

The present invention relates to non-volatile NOR-type memory strings. In particular, the present invention relates to an architecture for the 3-dimensional memory array.

2. Discussion of the Related Art

In high density three-dimensional memory structures, such as those disclosed in the Non-provisional Application, it is desirable to keep memory cells separated from each other by at least a certain distance in order to avoid the effects of fringing fields resulting from charge in one memory cell from interfering with the charge storage in the other memory cell, while maintaining the desirable high density. In the prior art, such as illustrated by FIGS. 1a and 1b, a NOR-type memory array includes memory cells 1 and 2 which share a single bit line 108. As shown in FIG. 1a, cells 1 and 2 are provided charge storage layers 107 and gate electrodes 109 ("local word lines") on opposite sides of shared bit line 108 directly across from each other. The charge storage layers 107 of memory cells 1 and 2 are separated by less than the width of their shared bit line 108. However, with decreasing feature sizes, memory cells 1 and 2 are in close enough proximity that each memory cell may disturb the other memory cell during program, erase, or read operations.

FIG. 1b shows a completed memory structure 100 having word lines that are aligned in the manner illustrated in FIG. 1a. As shown in FIG. 1b, three-dimensional memory structure 100 includes a regular array of memory cells, each illustrated by memory cell 120. (Memory cell 120 shows in three dimensions each of cells 1 and 2.) In FIG. 1b, memory cell 120 includes channel region 112, which is provided between source region 110, drain region or bit line 108. In addition, memory cell 120 includes (i) charge-trapping material 107 provided between word line 109 and channel region 112, and (ii) conductor layer 113, provided adjacent and in contact with drain region or bit line 108, for reducing resistivity in drain region or bit line 108. The memory cells in each column of memory structure 100 are isolated from each other by dielectric layer 114.

FIG. 1c reproduces FIG. 9b of U.S. Patent Application Publication 2016/0086970 to Peng, in which word lines formed above a memory structure ("global word lines") are provided in a staggered fashion to adjacent bit lines (i.e., the staggered local word lines serve different bit lines), but not relative to a single shared bit line. In other words, adjacent global word lines Such an arrangement does not decrease the distance between the nearest memory cells. These approaches also sacrifice memory array density.

SUMMARY

The present invention avoids the potential for disturbs between memory cells in close proximity without sacrificing memory cell density. According to one embodiment of the present invention, a staggered memory cell architecture staggers memory cells on opposite sides of a shared bit line preserves memory cell density, while increasing the distance between such memory cells, thereby reducing the possibility of a disturb. The memory cells along a first side of a shared bit line are connected to a set of global word lines provided underneath the memory structure, while the memory cells on the other side of the shared bit line—which are staggered relative to the memory cells on the first side—are connected to global word lines above the memory structure.

The present invention is better understood upon consideration of the detailed description below, in conjunction with the accompanying drawings.

BRIEF DESCRIPTION OF THE DRAWINGS

FIG. 1b shows completed three-dimensional memory structure 100 having word lines 109 that are aligned, in the manner illustrated in FIG. 1a.

FIG. 2b shows completed three-dimensional memory structure 200 of the current invention having word lines that are staggered, in the manner illustrated in FIG. 2a.

To facilitate cross-reference among the figures and to simplify the detailed description below, like elements in the figures are assigned like reference numerals.

DETAILED DESCRIPTION OF THE PREFERRED EMBODIMENTS

Figure 2A:
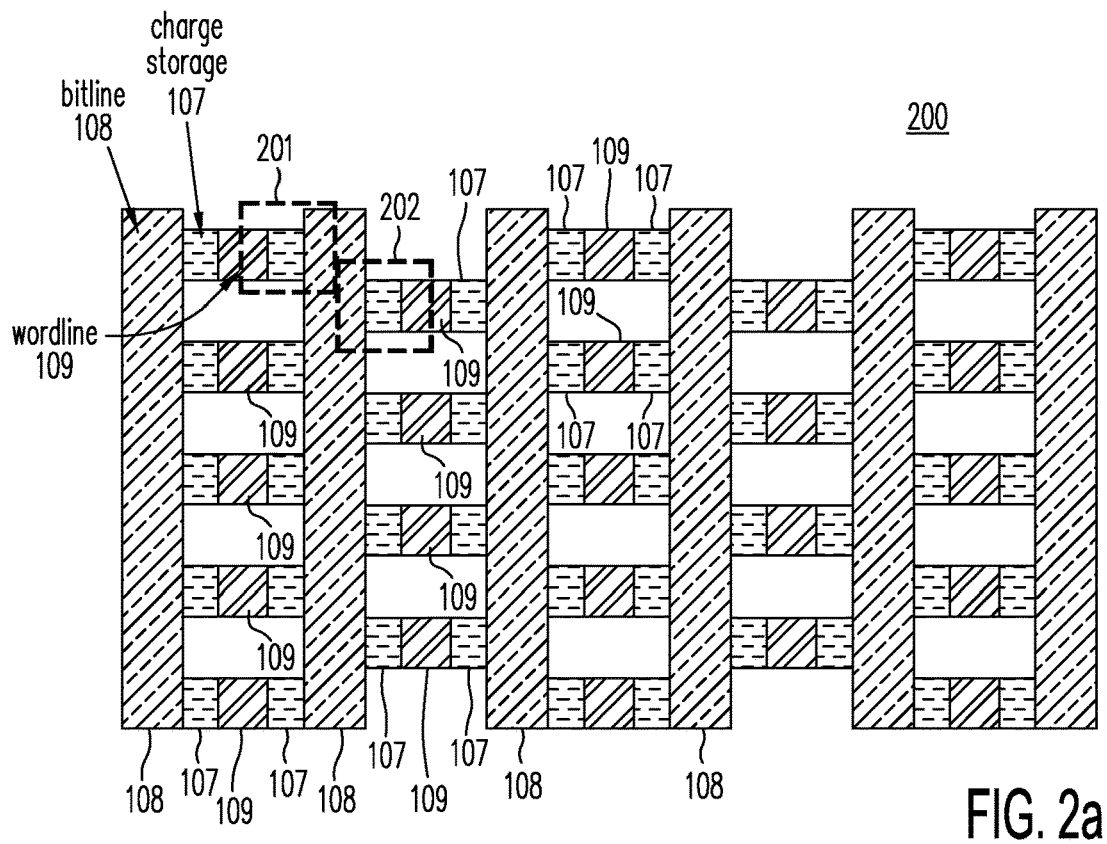
FIG. 2a show memory cells 201 and 202 of memory structure 200 on opposite sides of shared bit line 108 being offset or "staggered" in position relative to each other, according to one embodiment of the present invention.

FIG. 2a show memory cells 201 and 202 of memory structure 200 on opposite side of shared bit line 108 being offset or "staggered" in position relative to each other, according to one embodiment of the present invention.

Figure 1A:
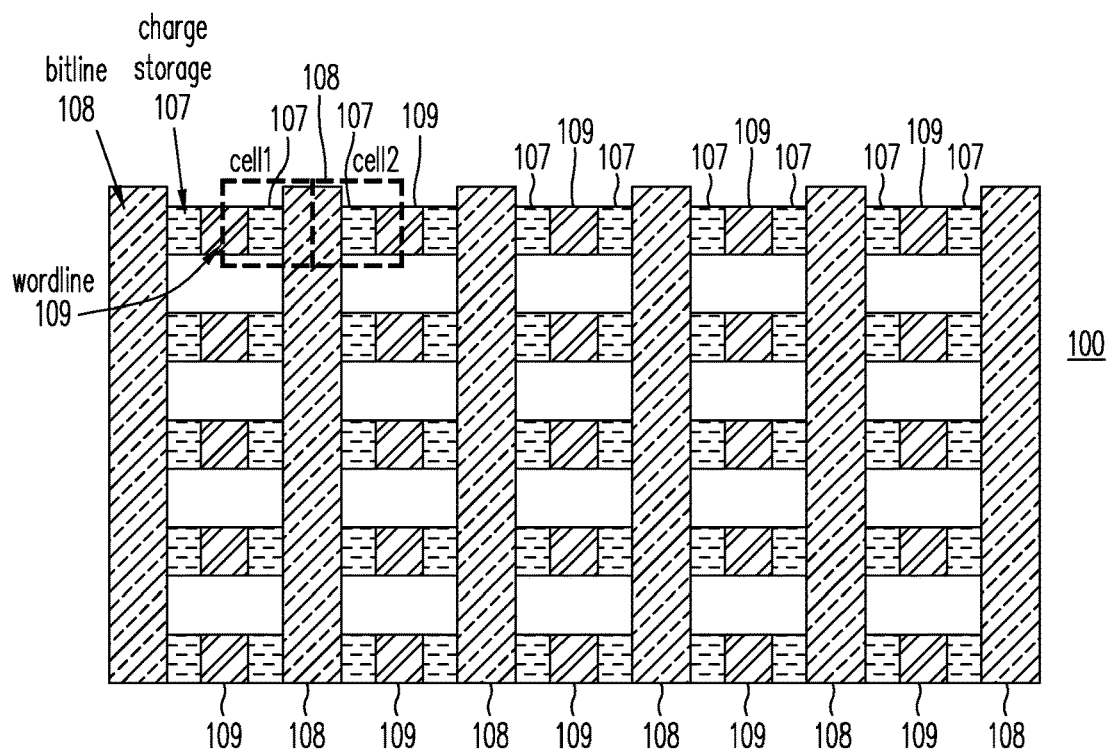
FIG. 1a shows in a top plan view a NOR-type memory array in memory structure 100, with memory cells 1 and 2 sharing single bit line 108.
Figure 1B:
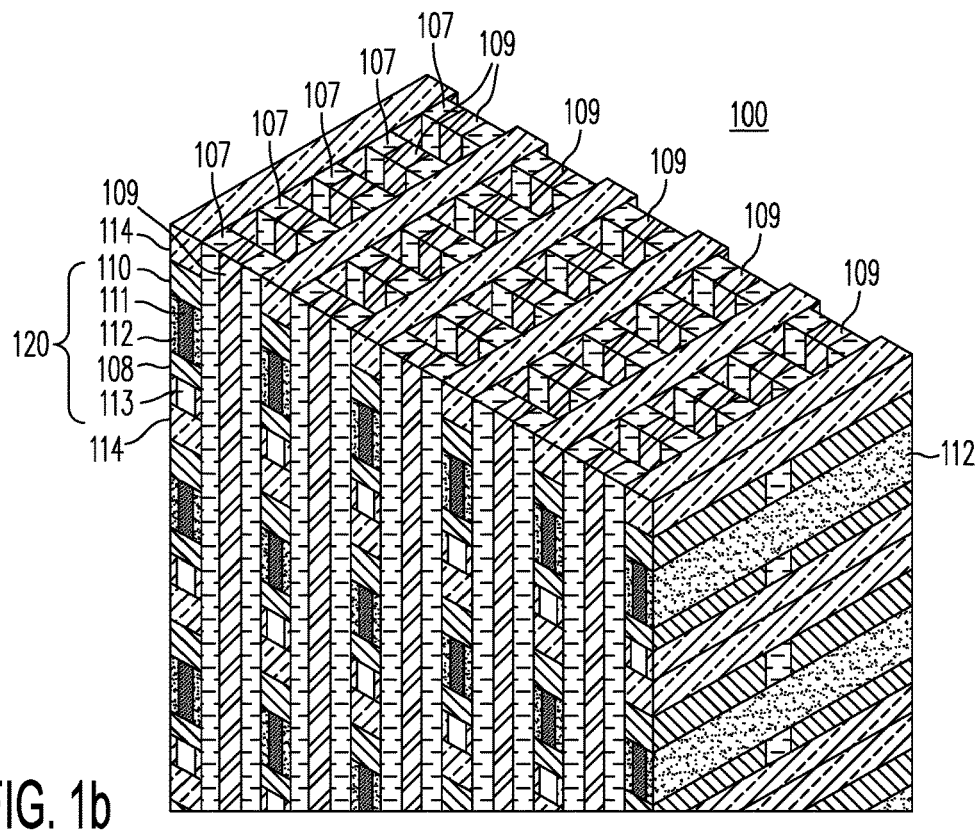
Figure 1C:
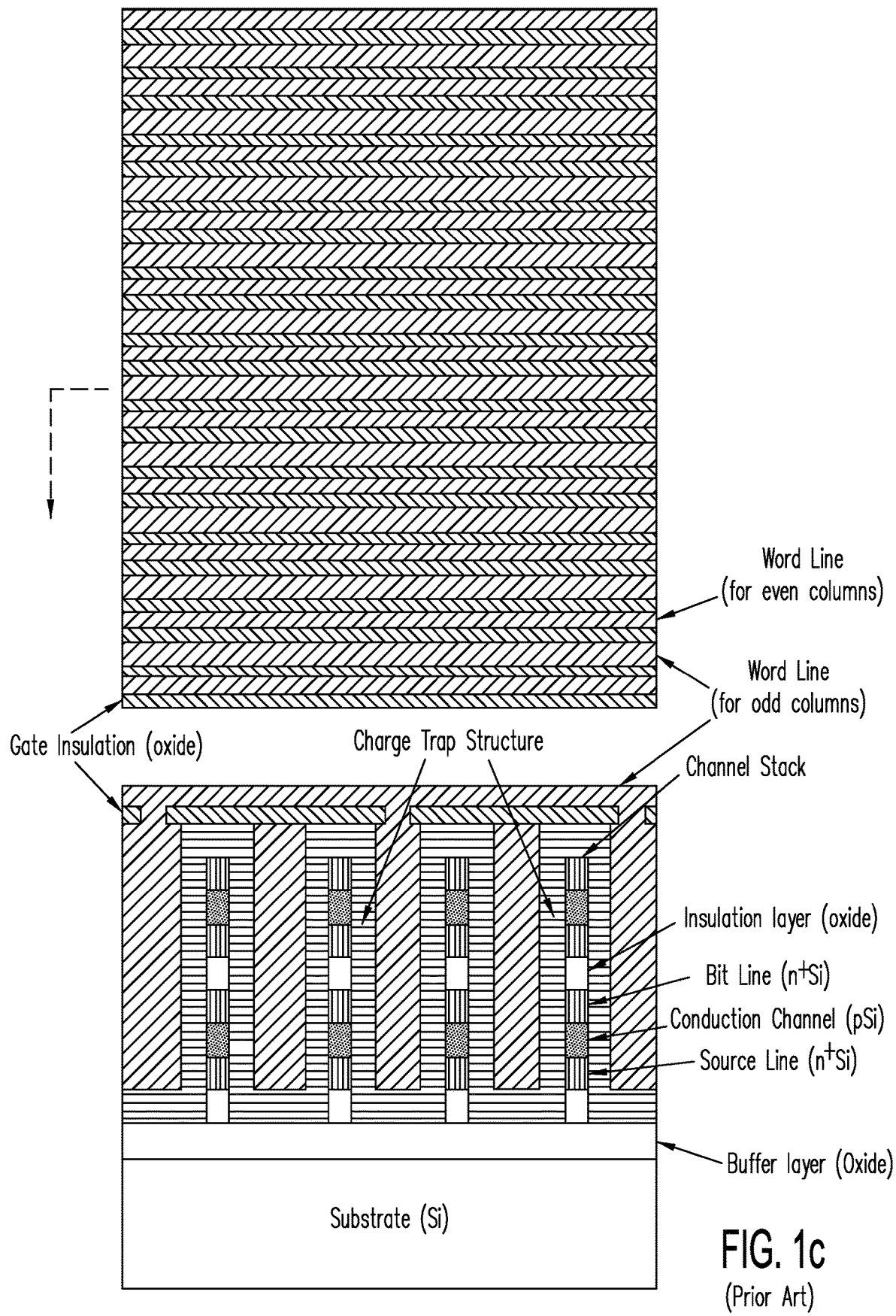
FIG. 1c shows a prior art NOR-type memory structure with alternate word lines atop the array positioned side by side staggered between odd columns and even columns (reproduced from FIG. 9b of U.S. Patent Application Publication 2016/0086970 to Peng)
Figure 2B:
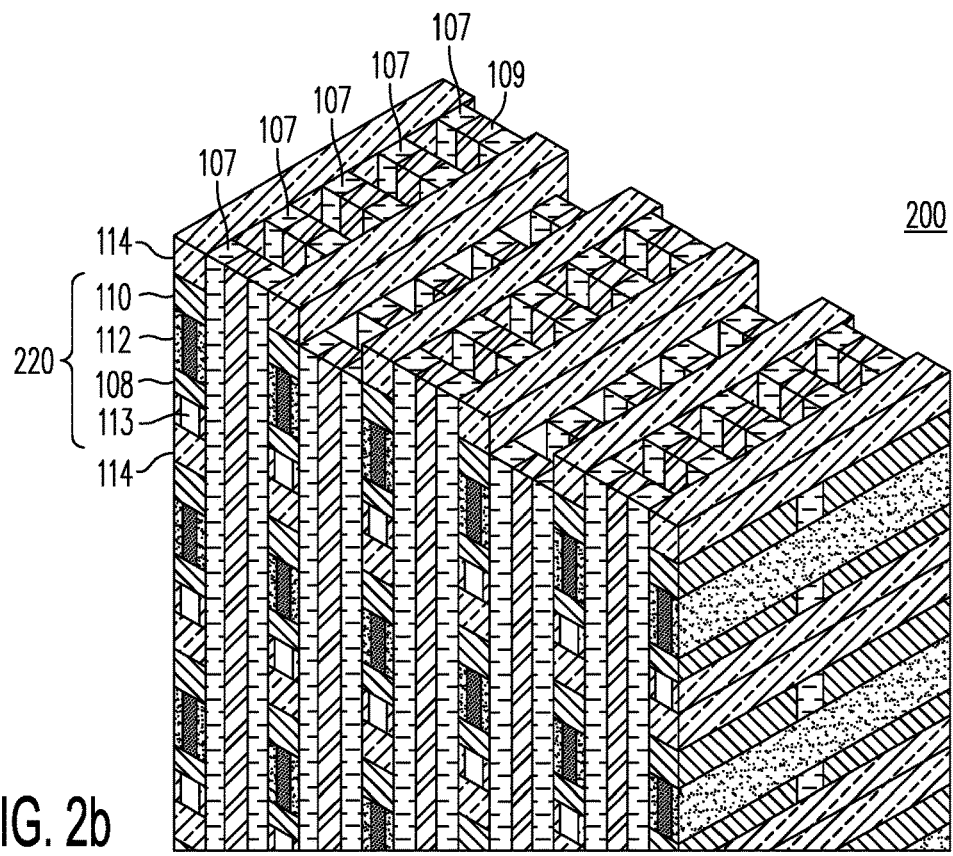

FIG. 2b shows completed memory structure 200 having staggered word lines in the manner illustrated in FIG. 2a. As in memory structure 100 of FIG. 1a, FIG. 1b shows completed memory structure 200 having word lines that are aligned in the manner illustrated in FIG. 2a. As shown in FIG. 2b, three-dimensional memory structure 200 includes a regular array of memory cells, each illustrated by memory cell 220. (Memory cell 220 shows in three dimensions each of memory cells 201 and 202.) In FIG. 2b, memory cell 220 includes channel region 112, which is provided between source region 110, drain region or bit line 108. In addition, memory cell 220 includes (i) charge-trapping material 107 provided between word line 109 and channel region 112, and (ii) conductor layer 113, provided adjacent and in contact with drain region or bit line 108, for reducing resistivity in drain region or bit line 108. The memory cells in each column of memory structure 200 are isolated from each other by dielectric layer 114.

Unlike the directly across arrangement for the nearest memory cells of FIGS. 1a and 1b, memory structure 200 of FIGS. 2a and 2b has the word lines 109 of its nearest memory cells on opposite sides of shared bit line 108 offset or staggered relative to each other. The offset is maintained over the entire length of bit line 108. As any pair of nearest memory cells on opposite sides of shared bit line 108 are now offset to each other, unlike the directly across arrangement for the nearest memory cells shown in FIG. 1a, the net result is a considerable increase in the nearest distance between the charge storage layers in these memory cells, as compared to memory cells in the aligned word line case of FIG. 1a. The increase in the nearest distance help reduce program disturb between the nearest memory cells.

Figure 3A:
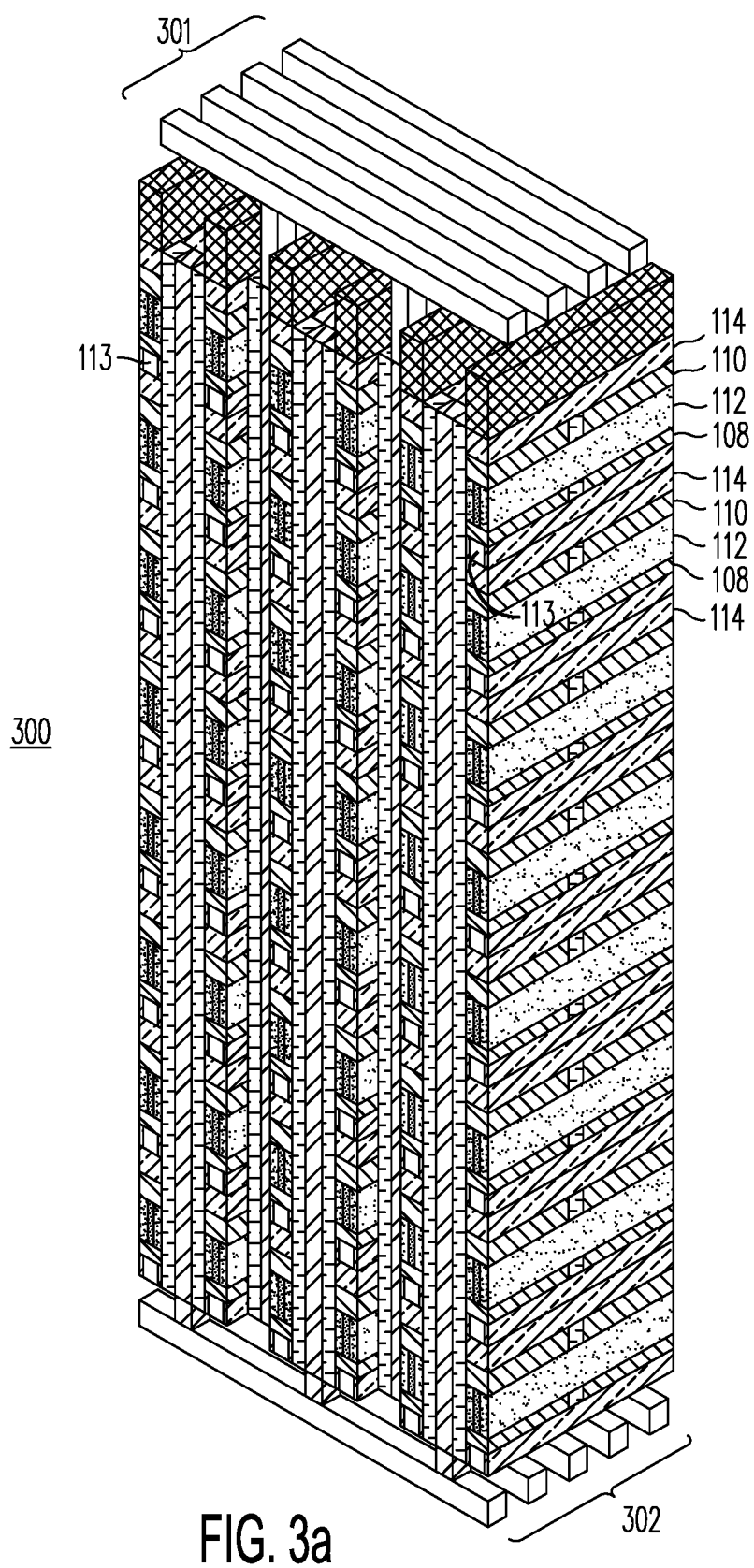
FIG. 3a shows memory structure 300 having interconnects ("global word lines") routing signals above and below the memory structure, that run parallel to, but offset to be staggered relative to, each other.
Figure 3B:
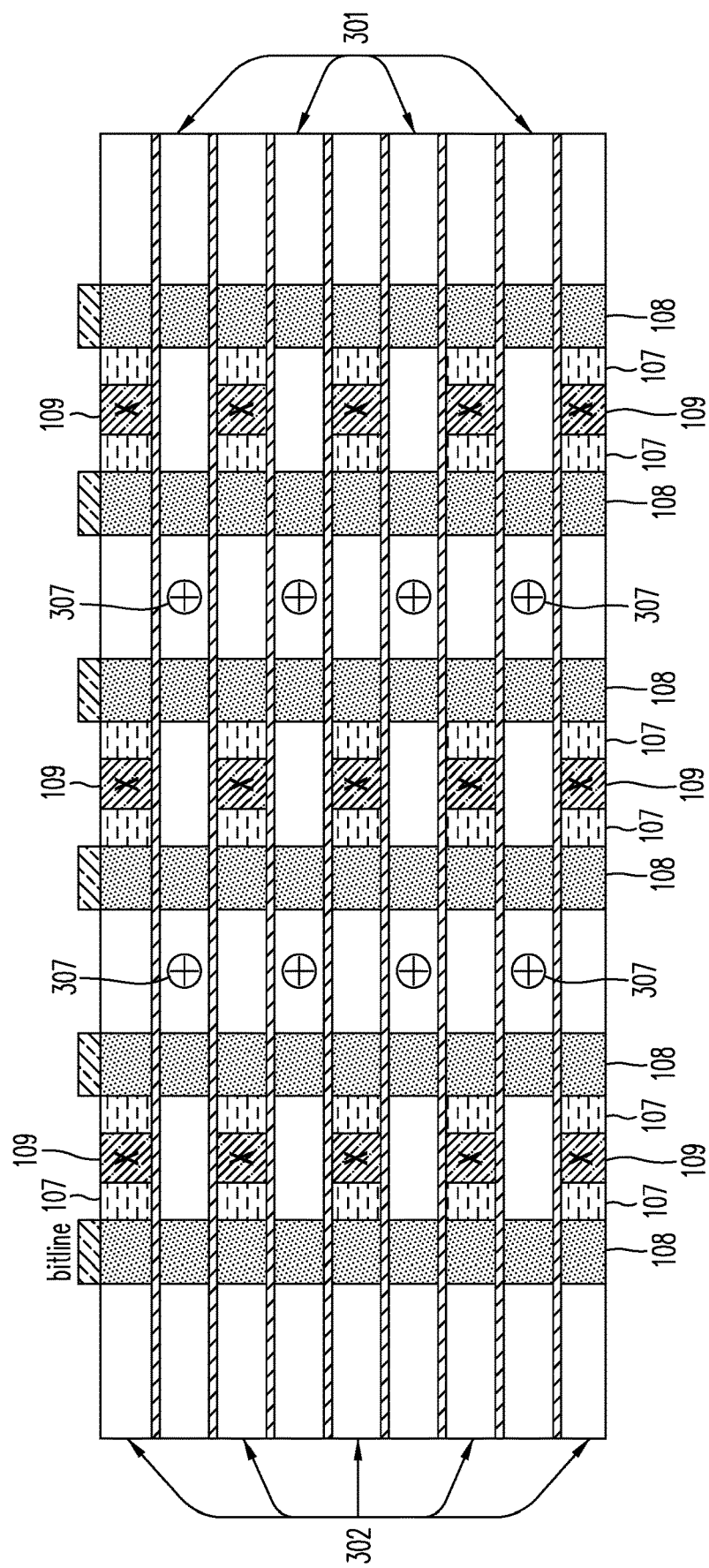
FIG. 3b shows, in plan view, the conductors of the top global word lines are offset from the parallel conductors of the bottom global word lines by approximately one half-pitch.

The connections of word lines to global interconnects can be accomplished by any of several approaches. FIG. 3a shows memory structure 300 having interconnects layers ("global word lines") 301 and 302 routing signals above and below a memory array (referred to as "top global word lines" 301 and "bottom global word lines" 302, respectively). The memory array in memory structure 300, for example, may be the memory array in memory structure 200 of FIG. 2b. In FIG. 3a, the conductors of top global word lines 301 and bottom global word lines 302 may run parallel to each other, having substantially the same conductor spacing. FIG. 3b shows one arrangement in which the conductors of the global word lines 301 and 302 are offset from each other by approximately one half-pitch, as shown in a top plan view. FIG. 3b shows also the positions of shared bit lines 108, showing that no additional silicon area is required to achieve the dense memory arrays with staggered word lines.

Under this arrangement, as shown in FIG. 3b, local word lines 109 on one side of shared bit line 108 can contact directly bottom global word lines 302 (via positions marked by "X"), while local word lines 109 on the opposite side of their shard bit line 108 can contact directly top global word lines 301 (via positions 307 marked by "⊕"). In this manner, the highest memory cell density is achieved while at the same time also having considerably reduced the parasitic interference between the staggered (e.g., memory cells 201 and 202 of FIG. 2a).

The adverse impact of cell-to-cell interference is illustrated by the following example on memory cells 1 and 2 of FIG. 1a: Assume adjacent memory cells 1 and 2 are initially in their erased state. Memory cell 1 is next programmed to its desired threshold voltage $V_{pg1}$. However, when memory cell 2 is subsequently also programmed to its desired threshold voltage $V_{pg2}$, the threshold voltage of memory cell 1 may be shifted from its previous programmed threshold voltage $V_{pg1}$. The amount of threshold voltage shift in memory cell 1 depends on the parasitic coupling between memory cells 1 and 2. Relative to back-to-back memory cells (e.g., memory cells 1 and 2 of FIG. 1a), staggered memory cells of the present invention (e.g., memory cells 201 and 202 of FIG. 2a) have considerably reduced parasitic coupling. The undesirable cell-to-cell interference is particularly problematic when the memory cells store more than one binary bit of information under a multilevel cell (MLC) mode of operation, where each memory cell may be programmed to any one of several threshold voltages. The required voltage separation between the threshold voltages is correspondingly smaller, relative to the single-binary bit mode of operation. Staggering memory cells 201 and 202 of FIG. 2a relative to each other substantially reduces such interference, thereby making MLC a viable operating mode.

The detailed description above is provided to illustrate specific embodiments of the present invention and is not intended to be limiting. Various modifications and variations within the scope of the present invention are possible. The present invention is set forth in the accompanying claims.

I claim:

1. A portion of a NOR-type memory array—also referred to as a "NOR memory string"—comprising:
    a bit line having a length that extends along a first direction;
    a source line, and
    a plurality of memory cells formed along a first side and a second side of the bit line, the first and the second sides of the bit line being opposite each other along the length of the bit line, each memory cell comprising (i) a channel region adjacent to both the bit line and the source line; (ii) a gate electrode having a length extending along a second direction substantially orthogonal to the first direction; and (iii) a charge storage region provided between the channel region and the gate electrode; wherein the gate electrodes of the memory cells along the first side of the bit line and the gate electrodes of the memory cells along the second side of the bit line are provided in a staggered configuration.

2. The NOR memory string of claim 1, wherein the bit line and the source line are formed out of first and second semiconductor layers, respectively, wherein the first and second semiconductor layers are of a first conductivity type provided one atop of another along a first direction.

3. The NOR memory string of claim 2, further comprising a semiconductor substrate with a planar surface normal to the first direction.

4. The NOR memory string of claim 2, wherein each of first and second semiconductor layers comprise a plurality of strips extending lengthwise along a second direction and spaced apart from each other along a third direction, the second and third directions being each substantially orthogonal to the first direction and being orthogonal to each other.

5. The NOR memory string of claim 4, wherein the channel region of each memory cell is formed out of a third semiconductor layer of a second conductivity type opposite the first conductivity type.

6. The NOR memory string of claim 5 wherein the channel region and the gate electrode of each memory cell are electrically isolated from each other by the charge-storage region.

7. The NOR memory string of claim 4, wherein the gate electrodes of the memory cells provided along the first side of the bit line also serve as gate electrodes in memory cells of another NOR memory string, wherein the other NOR memory string has a bit line also extending lengthwise along the first direction.

8. The NOR memory string of claim 7, further comprising an interconnects layer having conductors each in electrical contact with one of the gate electrodes in each of the NOR memory strings.

9. The NOR memory string of claim 8, wherein the interconnects layer comprises a plurality of conductors each extending lengthwise along the second horizontal direction.

10. The NOR memory string of claim 9, wherein the interconnects layer is provided above the first and second NOR memory structures.

11. The NOR memory string of claim 9, wherein the interconnects layer is provided above or below the NOR memory structures.

12. The NOR memory string of claim 9, further comprising a semiconductor substrate with a planar surface normal to the first direction.

13. The NOR memory string of claim 1, wherein the gate electrodes each comprise polysilicon.

14. The NOR memory string of claim 1, wherein each memory cell stores more than one bit of information.

* * * * *